METHOD OF MAKING BONDED WIRE CIRCUITS

Filed Jan. 2, 1964 2 Sheets-Sheet 1

Inventor:
Clifford K. Lodder,
by Irving M. Freedman
His Attorney.

Jan. 31, 1967 C. K. LODDER 3,300,851

METHOD OF MAKING BONDED WIRE CIRCUITS

Filed Jan. 2, 1964 2 Sheets-Sheet 2

Inventor:
Clifford K. Lodder,
by Irving M. Freedman
His Attorney.

United States Patent Office 3,300,851
Patented Jan. 31, 1967

3,300,851

METHOD OF MAKING BONDED WIRE CIRCUITS

Clifford K. Lodder, Ithaca, N.Y., assignor to General Electric Company, a corporation of New York Filed Jan. 2, 1964, Ser. No. 335,272
11 Claims. (Cl. 29—470.1)

This invention relates to electrical and electronic bonded wire circuits, and more particularly to an improved method for the assembly of bonded wire circuits, and constitutes an extension of the invention set forth in U.S. Patent 2,977,672, granted April 4, 1961, to Thomas A. Telfer and assigned to the same assignee as the present application.

The aforementioned patent teaches a method of bonding electrical conductors separated by a deformable insulating member in which the bonding operation may be performed without prepunching the insulating member.

It is an object of this invention to provide an improved method of making a circuit assembly.

Another object of this invention is to provide an improved method of bonding components to insulated multi-conductor cables in flattened, tape form.

Yet another object of this invention is to provide an improved method of forming a circuit assembly on insulated multi-conductor cable which provides chemically-clean, hermetically-sealed conductor junctions.

A further object of this invention is to provide an improved method of fabricating circuits exhibiting greater reliability than presently used methods.

A still further obpect of this invention is to provide an uncomplex yet improved bonded wire circuit which is less expensive than that of the prior art.

In accordance with one form of the invention, there is provided a method of forming an electrical circuit assembly directly upon laterally extending flexible insulating tapes of the type having a plurality of generally parallel spaced flat ribbon-like conductors embedded therein by flattening the ends of the leads of the circuit components to be bonded to the tape, positioning the flattened ends of the component leads proximate to the desired conductors of the tape to which they are to be bonded and separated from the desired conductors by deformable insulation. A layer of deformable plastic is provided at least on the side of the flattened component leads which is remote from the tape. A pair of ultrasonic bonding members are positioned on either side of a junction of the lead conductor to be joined, and ultrasonic energy is applied through the bonding members perpendicular to the surface of the tape. The ultrasonic energy is discontinued after the conductors are brought into intimate contact and are bonded. Pressure is maintained on the junction until the deformable plastic has formed a hermetically-sealed environment around the junction.

More particularly, the desired circuit configuration may be further provided by removing portions of the ribbon-like conductors of the tape and bonding interconnecting conductors which extend obliquely between the ribbon-like conductors to be bonded. This bonding may be accomplished by the same method utilized in bonding the flattened components leads to the ribbon-like conductors of the tape.

For a better understanding of this invention, reference may be made to the accompanying drawings in which.

Figure 1:
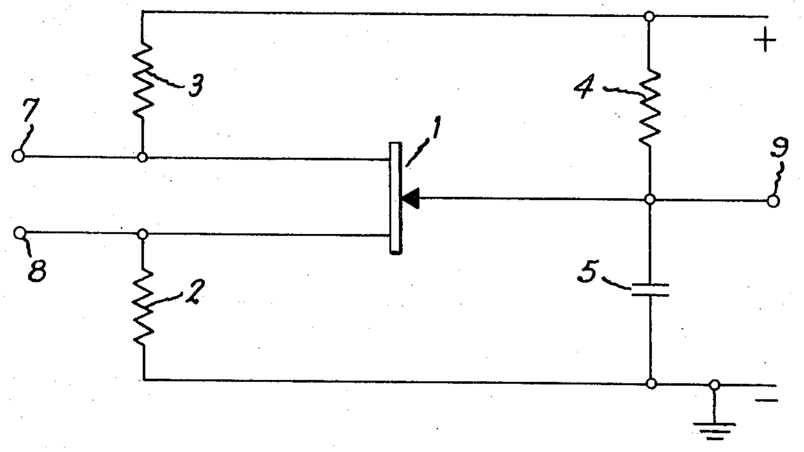
FIGURE 1 is a circuit diagram illustrating an example of an electronic circuit which can be built up on insulated flat conductor tape using the teachings of the invention.

Referring to FIGURE 1, there is shown a schematic diagram of a relaxation oscillator comprising a unijunction transistor or double based diode 1, resistors 2, 3, and 4, capacitor 5, input terminals 7 and 8 and output terminal 9 connected as shown in the figure.

The exact configuration of the circuit and its operation form no part of this invention. However, the particular circuit shown may be more completely understood by reference to page 142 of the General Electric Transistor Manual (5th edition), published by the General Electric Company, 1961.

Figure 2:
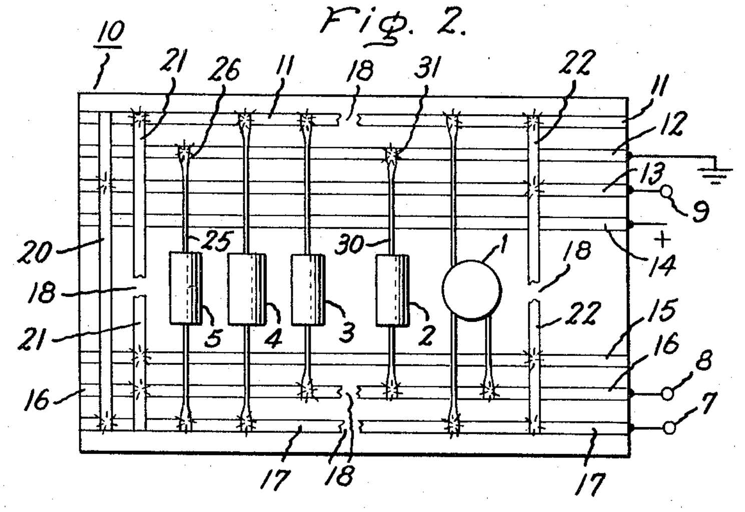
FIGURE 2 is a diagrammatic illustration of how the electronic components shown in FIGURE 1 are mounted and joined to the flat conductor cable and circuit interconnections made therebetween.

The fabrication of an improved circuit in acordance with the subject invention comprises mounting and various electrical components shown in FIGURE 1 on an insulated flat conductor cable to form the desired circuit configuration. Referring to FIGURE 2, there is shown an insulated flat conductor cable 10 of pressure deformable insulating material in which the flat parallel conductors 11, 12, 13, 14, 15, 16 and 17 respectively are embedded. The flat conductor cable may be, for example, that identified as IM–3–14, sold by the Tape Cable Corporation, Rochester, New York. In that cable, the plurality of flattened copper conductors are 0.0017 by 0.030 inch on 0.100 inch centers and are embedded in type M polyester insulation. The ends of the leads or pigtails of the electronic components to be bonded to the tape or cable 10 are flattened to facilitate their connection to the cable conductors. For use with the cable described above, it was found that flattening the ends of the component leads to approximately 0.005 inch thick by 0.030 inch wide was suitable, although the exact dimensions were not critical. The various electronic components shown in FIGURE 1 are positioned for connection on the flat conductors 11–17 as shown in FIGURE 2, that is capacitor 5 is positioned such that its leads or pigtails extend between conductors 12 and 17, resistor 4 is positioned for connection between conductor 11 and 17, resistor 3 is positioned for connection between conductors 11 and 16, resistor 2 is positioned for connection between conductors 12 and 16, and unijunction transistor 1 is positioned for connection of its bases to conductors 16 and 17 respectively and its emitter to conductor 11.

The conductor 11 is disconnected or broken as shown by the symbol between resistor 3 and the emitter of transistor 1, conductor 16 is disconnected between resistors 2 and 3, and conductor 17 is disconnected between resistor 4 and the base of transistor 1. The disconnections may be performed by a punching operation either before or after the components are connected, or through use of the ultrasonic welder as described below.

Interconnections between the components are formed by conductors 20, 21 and 22 positioned at right angles to conductors 11–17 and connected and disconnected as shown in FIGURE 2 to provide the desired interconnections between the components. These interconnecting conductors may be provided by a second piece of flat conductor cable placed at right angles to cable 10, and positioned on the side of cable 10 opposite to the electronic components.

The input terminals 7 and 8 are connected to conductors 16 and 17 respectively as shown in FIGURE 2 while the output terminal 9 is connected to conductor 13.

Figure 3:
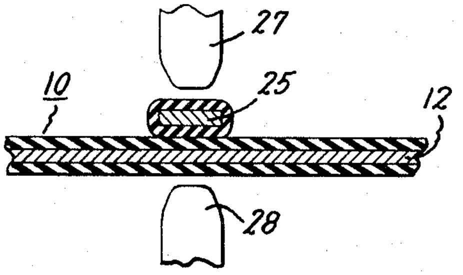
FIGURES 3–5 are cross-sectional views illustrating the steps of bonding a conductor lead to a conductor in the tape in accordance with the invention.
Figure 4:
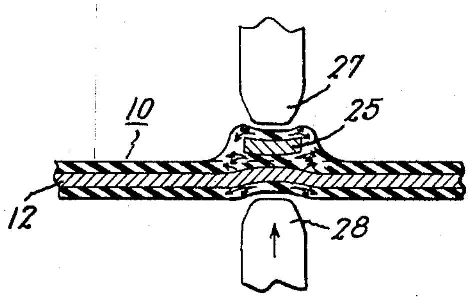
Figure 5:
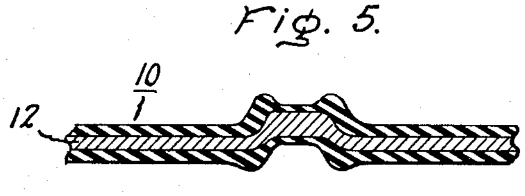

The method of forming the connections between the electronic components 1–5, the connecting conductors 20–22, and terminals 7–9 with the flat conductors 11–17 is illustrated in FIGURES 3–5.

Referring to FIGURE 3, the flattened end of the lead 25 of capacitor 5 has been positioned in close proximity to conductor 12, one of the plurality of conductors embedded in the deformable insulating material of the flat conductor cable tape 10. The lead 25 has been previously coated with a pressure deformable insulating material such as Teflon or polyester plastic. A pair of ultrasonic welding tips 27 and 28 are positioned on either side of the pigtail 25 and conductor 12 respectively. It has been found for example, that a suitable ultrasonic welder is that identified as the Rick Soundwelder, Model 10, manufactured by Rick Research of Elmira, New York. Ultrasonic energy is then applied perpendicular to the surface of the tape 10 through the welding tips as shown in FIGURE 4. Concentrated heat is developed in the weld area with the highest temperature being between the lead 25 and conductor 12. As the plastic insulation softens, it is forced sideways until the lead 25 and conductor 12 meet. The outside insulation surfaces adjacent the welding tips 27 and 28 do not soften because the cool welding tips carry the heat away. The movement of the insulation is shown by the arrows in FIGURE 4.

Pressure and ultrasonic energy from the welding tips forces the conductor 12 and pigtail 25 into intimate broad area contact, completely displacing the insulation as shown in FIGURE 5.

Continued pressure and ultrasonic energy insures a low-resistance, high-strength permanent junction. The ultrasonic energy is then shut off while pressure is maintained on the welding tips 27 and 28, allowing the plastic to solidify and lock the end of lead 25 and conductor 12 in intimate contact in a hermetically-sealed environment.

The entire weld process takes only a few seconds.

The welding tips 27 and 28 are positioned on opposite sides of the various junctions to be welded to successively perform the bonding or welding operation.

While the exact processes taking place during bonding are not known, it appears that the pressure and heat generated during the bonding or weld cycle cause fusion of the facing surfaces of the insulation with ultrasonic agitation of the plastic causing a gross exchange of molecules between the surfaces of plastic in contact producing an intimate bonding of the insulation layers. No oxygen, moisture, or other environmental contaminant can reach the conductor surfaces before, during or after the bonding cycle. Microscopic examination of the junction shows no trace of insulation between the conductors. Ultrasonic agitation of the molten plastic between the conductors evidently provides a series of lateral shock waves and cavitation action to remove any residual traces of foreign matter from the clean metal surfaces of the conductors being bonded. Such foreign matter, if present, is apparently carried away from the conductor junction interface by the plastic and is captured by the solidified resin.

All the insulation is removed by the combined action of the phenomena involved including the pressure on the junction, shock waves, and surface tension of the plastic.

Figure 6:
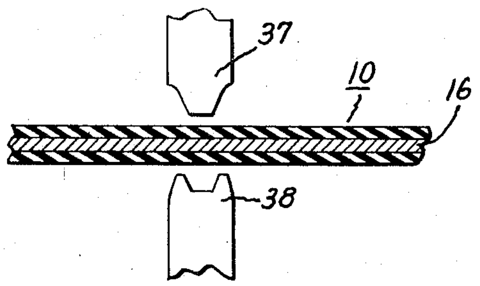
FIGURE 6 shows the form of a pair of ultrasonic welding tips suitable for providing disconnect or breaks in the conductors.

The ultrasonic welder can also be used to make the disconnects in the conductor cables such as 10. Special tips, one of which has a sharp cutting edge, mating with a cavity in the other, are brought together and ultrasonic energy is applied to break or remove portions of the conductor and seal the ends in plastic. No stripping or reinsulation is necessary. The general configuration of a pair of tips 37 and 38 suitable for the disconnect operation is shown in FIGURE 6, positioned opposite the conductor 16 which is to be disconnected between resistors 2 and 3 in accordance with FIGURE 2.

Figure 7:
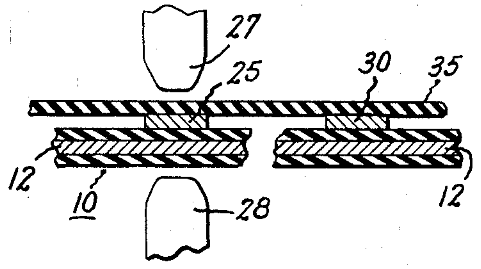
FIGURE 7 shows the use of a separate outer insulated layer which may be used with method shown by the other figures.

Instead of utilizing insulated leads on the electronic components, the bare flattened leads of the electronic components may be covered by a layer of suitable plastic after the leads are positioned as shown in FIGURE 2. The layer of plastic may be a polyester plastic, such as type M polyester, or plastic sold under the trade-names Teflon and Mylar. A suitable thickness for the plastic is approximately 0.007 inch. A cross sectional view of such an arrangement is shown in FIGURE 7. Referring to FIGURE 7, the bare flattened leads 25 and 30 of capacitor 5 and resistor 2 respectively are positioned on the tape 10 adjacent or proximate to the conductor 12. A layer of plastic 35 is positioned over the leads in the upper half of FIGURE 2 covering the leads 25 and 30. The leads 25 and 30 are then successively welded to the conductor 12 in the same manner as the method described in regard to FIGURES 3–5. A difference is that the plastic layer 35 provides plastic to encapsulate the junction rather than the plastic pre-coated on the leads. While the plastic layer 35 enables the use of standard components, the plastic coated leads of FIGURE 3 enables the use of components having leads which are cleaner prior to coating and which are then protected from the ambient atmosphere before, during, and after the bonding process to insure chemically-clean junctions.

The flat cable circuit described readily lends itself to automation due to the fact that there is a closely controlled grid pattern with all conductors in known positions which makes it an easy matter for a computer to reduce the circuit to a punch tape or cards. These tapes or cards can then be used to control the machinery for positioning the welding tips for making contacts, for positioning the disconnect or punching machinery, and for welding the components in place to produce completed electronic circuits. The welding may be automatically programmed to eliminate the variable of operator skill and provide precisely the right amount of energy, pressure, and time to the bonding of each junction. Thus, it is possible to utilize the method to deliver complete harness assemblies with little or no manual labor.

The completed electronic circuit may then be "potted" or embedded in a suitable plastic or epoxy resin, if desired.

It has been found that electrical and electronic circuits fabricated in the manner described above provide a combined plurality of advantages not possible with prior art bonding methods. The junctions formed are chemically-clean and hermetically-sealed thus providing protection against corroding materials before, during, and after the welding. The junction area formed is many times greater than the conductor cross-section area. For example, a typical junction formed from two conductors having a cross-section of 1.7 times 30 milli-inches form a junction area up to 18 times the area of the cross-section of the conductor. A unified structure results, since the conductors and insulation are bonded together in one integral unit distributing the mechanical load over the entire assembly, thus providing a stronger and more reliable assembly. Joining the circuit components directly to the conductor cable minimizes junctions and eliminates series junctions which often occur in conventional harness arrangements increasing the reliability of the resultant assembly.

In the bonding method described for bonding a flattened lead 25 of an electronic component to the flat conductor cable, it is apparent that it is also applicable to the bonding of the interconnecting leads or conductors such as 20, 21, and 22 of FIGURE 2 to the flat cable 10. These leads may be separate leads or, as indicated above, may be provided by a short piece of flat multi-conductor cable placed at right angles to cable 10.

Therefore, while particular embodiments of the subject invention have been shown and described herein, they are in the nature of description rather than limitation, and as will occur to those skilled in the art various changes, modifications, and combinations may be made within the province of the appended claims without departing either in spirit or scope from the invention in its broader aspects.

What I claim as new and desire to secure by Letters Patent of the United States is:

1. The method of forming an electrical circuit assembly directly upon laterally extending flexible insulating deformable plastic tapes having a plurality of generally parallel spaced flat ribbon-like conductors embedded therein comprising:

flattening the ends of the leads of the components to be bonded to said tape,
positoning the flattened end of a component lead proximate to the desired conductor of the tape to which it is to be bonded and separated from the desired conductor by deformable insulation,
providing a layer of deformable plastic at least on the side of said flattened component lead which is remote from said tape,
positioning a pair of bonding members on either side of the junction of the lead and conductor to be bonded,
applying ultrasonic energy to said bonding members,
discontinuing the ultrasonic energy after the lead and conductor have been brought into intimate contact and are bonded, and
maintaining a pressure on the junction until the deformable plastic has formed a hermetically-sealed environment around said junction.

2. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape,
positioning the flattened end of the component leads proximate to the desired conductors of the tape to which they are to be bonded and separated from the desired conductors by deformable insulation,
providing a layer of deformable plastic at least on the side of said flattened component leads which is remote from said tape,
positioning a pair of bonding members on either side of a junction of the lead and conductor to be bonded,
applying ultrasonic energy to said bonding members,
discontinuing the ultrasonic energy for each junction after the lead and conductor have been brought into intimate contact and are bonded, and
maintaining a pressure on the junction until the deformable plastic has formed a hermetically-sealed environment around said junction.

3. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape,
positioning the flattened end of the component leads proximate to the desired conductors of the tape to which they are to be bonded and separated from the desired conductors by deformable insulation,
providing a layer of deformable plastic at least on the side of said flattened component leads which is remote from said tape,
positioning a pair of bonding members on either side of a junction of the lead and conductor to be bonded,
applying ultrasonic energy to said bonding members,
discontinuing the ultrasonic energy for each junction after the lead and conductor have been brought into intimate contact and are bonded,
maintaining a pressure on the junction until the deformable plastic has formed a hermetically-sealed environment around said junction, and
removing portions of the ribbon-like conductors of said tape at appropriate places which will provide the desired circuit configuration.

4. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape,
positoning the flattened end of the component leads proximate to the desired conductors of the tape to which they are to be bonded and separated from the desired conductors by deformable insulation,
providing a layer of deformable plastic at least on the side of said flattened component leads which is remote from said tape,
positioning a pair of bonding members on either side of a junction of the lead and conductor to be bonded,
applying ultrasonic energy to said bonding members,
discontinuing the ultrasonic energy for each junction after the lead and conductor have been brought into intimate contact and are bonded,
maintaining a pressure on the junction until the deformable plastic has formed a hermetically-sealed environment around said junction,
removing portions of the ribbon-like conductors of said tape at appropriate places which will provide the desired circuit configuration, and
bonding interconnecting conductors which extend obliquely between said ribbon-like conductors to provide the desired circuit interconnections.

5. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape,
positioning the flattened end of the component leads proximate to the desired conductors of the tape to which they are to be bonded and separated from the desired conductors by deformable insulation,
providing a layer of deformable plastic at least on the side of said flattened component leads which is remote from said tape,
positioning a pair of bonding members on either side of a junction of the lead and conductor to be bonded,
applying ultrasonic energy through said bonding members perpendicular to the surface of the tape,
discontinuing the ultrasonic energy for each junction after the lead and conductor have been brought into intimate contact and are bonded,
maintaining a pressure on the junction until the deformable plastic has formed a hermetically-sealed environment around said junction,
removing portions of the ribbon-like conductors of said tape at appropriate places which will provide the desired circuit configuration, and
bonding interconnecting conductors which extend obliquely between said ribbon-like conductors to provide the desired circuit interconnections, said interconnecting conductors being bonded to said ribbon-like conductors in the same manner as the bonding of said component leads to said ribbon conductors.

6. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape, positioning the flattened end of the component leads proximate to the desired conductors of the tape to which they are to be bonded and separated from the desired conductors by deformable insulation, providing a layer of deformable plastic at least on the side of said flattened component leads which is remote from said tape, positioning a pair of ultrasonic welding members on either side of a junction of the lead and conductor to be bonded, applying ultrasonic energy through said welding members perpendicular to the surface of the tape, discontinuing the ultrasonic energy for each junction after the lead and conductor have been brought into intimate contact and are bonded, maintaining a pressure on the junction until the deformable plastic has formed a hermetically-sealed environment around said junction, removing portions of the ribbon-like conductors of said tape at appropriate places which will provide the desired circuit configuration, and bonding interconnecting conductors which extend obliquely between said ribbon-like conductors to provide the desired circuit interconnections, said interconnecting conductors being bonded to said ribbon-like conductors in the same manner as the bonding of said component leads to said ribbon conductors.

7. The method of forming an electrical circuit assembly directly upon laterally extending flexible insulating deformable plastic tapes having a plurality of generally parallel spaced flat ribbon-like conductors embedded therein comprising:

flattening the ends of the leads of the components to be bonded to said tape, coating the flattened ends of said leads with a deformable insulating material, positioning the flattened end of a component lead proximate to the desired conductor of the tape to which it is to be bonded and separated from the desired conductor by deformable insulation, positioning a pair of bonding members on either side of the junction of the lead and conductor to be bonded, applying ultrasonic energy to said bonding members, discontinuing the ultrasonic energy after the conductors have been brought into intimate contact and are bonded, and maintaining a pressure on the junction until the deformable plastic has formed a hermetically-sealed environment around said junction.

8. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape, coating the circuit components with a deformable insulating material, positioning the flattened end of the component leads proximate to the desired conductors of the tape to which they are to be bonded and separated from the desired conductors by deformable insulation, positioning a pair of bonding members on either side of a junction of the lead and conductor to be bonded, applying ultrasonic energy to said bonding members, discontinuing the ultrasonic energy for each junction after the lead and conductor have been brought into intimate contact and are bonded, and maintaining a pressure on the junction until the deformable plastic has formed a hermetically-sealed environment around said junction.

9. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape, coating the flattened ends of said leads and component with a deformable insulating material, positioning the flattened end of the component leads proximate to the desired conductors of the tape to which they are to be bonded and separated from the desired conductors by deformable insulation, positioning a pair of bonding members on either side of a junction of the lead and conductor to be bonded, applying ultrasonic energy to said bonding members, discontinuing the ultrasonic energy for each junction after the lead and conductor have been brought into intimate contact and are bonded, maintaining a pressure on the junction until the deformable plastic has formed a hermetically-sealed environment around said junction, and removing portions of the ribbon-like conductors of said tape at appropriate places which will provide the desired circuit configuration.

10. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape, coating the flattened ends of said leads with a deformable insulating material, positioning the flattened end of the component leads proximate to the desired conductors of the tape to which they are to be bonded and separated from the desired conductors by deformable insulation, positioning a pair of bonding members on either side of a junction of the lead and conductor to be bonded, applying ultrasonic energy to bonding members, discontinuing the ultrasonic energy for each junction after the lead and conductor have been brought into intimate contact and are bonded, maintaining a pressure on the junction until the deformable plastic has formed a hermetically-sealed environment around said junction, removing portions of the ribbon-like conductors of said tape at appropriate places which will provide the desired circuit configuration, and bonding interconnecting conductors which extend obliquely between said ribbon-like conductors to provide the desired circuit interconnections.

11. The method of forming an electrical circuit assembly directly upon laterally extending flexible insulating deformable plastic tapes having a plurality of generally parallel spaced flat ribbon-like conductors embedded therein comprising:

flattening the ends of the leads of the circuit components to be bonded to said tape, coating the flattened ends of said leads with a deformable insulating material, positioning the flattened end of the component leads proximate to the desired conductors of the tape to which they are to be bonded and separated from the desired conductors by deformable insulation, positioning a pair of bonding members on either side of a junction of the lead and conductor to be bonded, applying ultrasonic energy through said bonding members perpendicular to the surface of the tape, discontinuing the ultrasonic energy for each junction after the lead and conductor have been brought into intimate contact and are bonded.

maintaining a pressure on the junction until the deformable plastic has formed a hermetically-sealed environment around said junction, removing portions of the ribbon-like conductors of said tape at appropriate places which will provide the desired circuit configuration, and bonding interconnecting conductors which extend obliquely between said ribbon-like conductors to provide the desired circuit interconnections, said interconnecting conductors being bonded to said ribbon-like conductors in the same manner as the bonding of said component leads to said ribbon conductors.

References Cited by the Examiner

UNITED STATES PATENTS

| | | | |
|---|---|---|---|
| 2,872,565 | 2/1959 | Brooks | 174—84 |
| 2,946,119 | 7/1960 | Jones et al. | 29—497.5 |
| 2,977,672 | 4/1961 | Telfer | 29—497.5 |
| 3,022,814 | 2/1962 | Bodine | 156—73 |
| 3,156,514 | 11/1964 | Wing et al. | 29—155.55 |
| 3,200,210 | 8/1965 | Alonas et al. | 29—155.55 |

JOHN F. CAMPBELL, *Primary Examiner.*

L. J. WESTFALL, *Assistant Examiner.*